(12) United States Patent
Schermerhorn et al.

(10) Patent No.: US 6,790,779 B2
(45) Date of Patent: Sep. 14, 2004

(54) ANISOTROPIC DRY ETCHING TECHNIQUE FOR DEEP BULK SILICON ETCHING

(75) Inventors: James H. Schermerhorn, Ballston Spa, NY (US); Matthew C. Nielsen, Schenectady, NY (US); Richard J. Saia, Niskayuna, NY (US); Jeffrey B. Fortin, Niskayuna, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 184 days.

(21) Appl. No.: 10/202,331

(22) Filed: Jul. 24, 2002

(65) Prior Publication Data

US 2004/0018734 A1 Jan. 29, 2004

(51) Int. Cl.[7] .............................................. H01L 21/302
(52) U.S. Cl. ...................... 438/690; 438/243; 438/386; 438/964
(58) Field of Search ................................ 438/690, 243, 438/386, 964

(56) References Cited

U.S. PATENT DOCUMENTS

| | | | |
|---|---|---|---|
| 6,090,697 A | * | 7/2000 | Xing et al. ................. 438/618 |
| 6,171,970 B1 | * | 1/2001 | Xing et al. ................. 438/706 |
| 6,177,351 B1 | * | 1/2001 | Beratan et al. ............. 438/694 |
| 6,448,131 B1 | * | 9/2002 | Cabral et al. ............... 438/243 |
| 6,555,431 B1 | * | 4/2003 | Xing et al. ................. 438/253 |
| 6,596,547 B2 | * | 7/2003 | Aggarwal et al. ............ 438/3 |
| 6,600,183 B1 | * | 7/2003 | Visokay et al. ............. 257/295 |
| 2003/0162407 A1 | * | 8/2003 | Maex et al. ................ 438/725 |

* cited by examiner

Primary Examiner—John R. Niebling
Assistant Examiner—Olivia T. Luk
(74) Attorney, Agent, or Firm—Scully, Scott, Murphy & Presser

(57) ABSTRACT

A method for creating deep features in a Si-containing substrate for use in fabricating MEMS type devices is provided. The method includes first forming a thin Ni hardmask on a surface of a Si-containing substrate. The Ni hardmask is patterned using conventional photolithography and wet etching so as to expose at least one portion of the underlying Si-containing substrate. The at least one exposed portion of the Si-containing substrate, not containing the patterned hardmask, is then etched in a plasma that includes free radicals generated from a gaseous mixture of chlorine ($Cl_2$), sulfur hexafluoride ($SF_6$) and oxygen ($O_2$). The interaction of the gas species in the plasma yields a rapid silicon etch rate that is highly selective to the Ni hardmask. The etch rate ratio of Si to Ni using the inventive method is greater than 250:1.

16 Claims, 2 Drawing Sheets

US 6,790,779 B2

ANISOTROPIC DRY ETCHING TECHNIQUE FOR DEEP BULK SILICON ETCHING

FIELD OF THE INVENTION

The present invention relates to the fabrication of Si-based devices such as micro-electromechanical systems (MEMS) having high aspect ratio openings formed in a substrate thereof. More particularly, the present invention relates to a method of fabricating at least one deep opening having substantially smooth and nearly vertical sidewalls in a Si-containing substrate. The openings formed in the present invention, which can be useful for fabricating MEMS, have a depth, as measured from a top surface of the Si-containing substrate to the etched bottom wall, of about 50 microns, $\mu$m, or greater and an aspect (depth to width) ratio of about 10:1 or greater.

BACKGROUND OF THE INVENTION

In the field of semiconductor and magnetic device manufacturing, lithography and etching are generally employed to provide an opening into a substrate. Typically, the substrate is patterned by steps which include: applying a resist to a surface of the substrate, exposing the resist to a pattern of radiation, developing the patterned resist using a suitable resist developer to expose a portion of the underlying substrate, and etching the exposed portion of the substrate by a dry etching process such as reactive-ion etching (RIE) where chlorine-based or fluorine-based chemistries are employed.

Although conventional lithography and etching can be used to form such a feature in most types of semiconductor and magnetic devices, problems arise when deep Si features are needed for MEMS type devices as well as other Si-based devices. These problems include: a low etching rate, and/or lateral etching.

For example, when conventional RIE techniques utilizing chlorine-based chemistries are employed to form deep Si features, the etch rates are extremely slow (on the order of 500 Å/min or less). The creation of a very deep opening of 100 $\mu$m or more therefore requires unreasonably long cycle times. Faster etch rates can be achieved using fluorine-based chemistries, however, the resultant etch is too isotropic for forming deep Si features. That is, fluorine-based chemistries cause lateral etching to occur, in addition to the desired vertical etching of the deep Si features.

Enhanced RIE systems such as an Inductively Coupled Plasma (ICP) system can produce the higher etching rates required to satisfy cycle time requirements, but ICP systems usually do not etch anisotropically using fluorine-based chemistries or they do not demonstrate adequate selectively to the masking material using chlorine-based chemistries. A solution to the above problems (i.e., fast etching rates, non-lateral etching, and selectively to the mask) is to use a process where a series of separate etching and deposition steps are employed. In such a process, a portion of the Si-containing substrate to include the feature is anisotropically etched and then the gas phase plasma chemistry is changed and a passivation layer is formed on the etched sidewalls. This sequence of etching and deposition is cycled until the desired deep Si features are formed.

In this prior art process, dimensional control is maintained by the deposited sidewall passivation layer, but the sidewall features will consist of a series of steps (or staircases) formed as the process moves from an etch phase to a deposition phase if the chemistry is not under precise control. Moreover, special equipment modifications are needed to execute this process which adds extra cost to the overall device fabrication process.

A method is thus needed which is capable of forming deep openings in a Si-containing substrate wherein a fast etch rate is obtained without causing unwanted lateral etching. A method is also needed in which a fast etch rate and non-lateral etching can be achieved without the requirement of using separate etching and deposition processing steps.

SUMMARY OF THE INVENTION

The present invention provides a cost efficient and simple method for forming deep openings (on the order of about 50 $\mu$m or greater) in a surface of a Si-containing substrate. The inventive method is capable of forming deep openings that have a high aspect ratio (on the order of about 10:1 or greater). Moreover, the method of the present invention is capable of providing the above-mentioned deep openings while maintaining precise dimensional control. The inventive method also provides deep openings having nearly vertical sidewalls that are substantially smooth and residue free. The term "opening" is used herein to denote a breached region or area that can be formed into a Si-containing substrate. The breached region or area is typically three-dimensional. Illustrative examples of such openings include, but are not limited to: apertures, holes, tunnels, trenches, moats, passageways, vias, and gaps.

The method of the present invention is capable of forming deep openings in a Si-containing substrate at extremely fast etching rates (>500Å/min), without causing unwanted lateral etching Moreover, the deep openings are formed in the present invention without the need for using the sequential etching and deposition steps typically employed in the prior art.

Specifically, the method of the present invention includes first forming a thin Ni hardmask on a surface of a Si-containing substrate. The Ni hardmask is patterned using conventional photolithography and wet etching so as to expose at least one portion of the underlying Si-containing substrate. The at least one exposed portion of the Si-containing substrate, not containing the patterned hardmask, is then etched in a plasma that includes free radicals generated from a gaseous mixture of chlorine ($Cl_2$), sulfur hexafluoride ($SF_6$) and oxygen ($O_2$). The interaction of the gas species in the plasma yields a rapid silicon etch rate that is highly selective to the Ni hardmask. The etch rate ratio of Si to Ni using the inventive method is greater than 250:1.

Without wishing to be bound by any theory, it is believed that the addition of $SF_6$ to $Cl_2$ increases the Si etch rate. Moreover, it is believed that, during the course of the inventive etching step, chloro-fluoro compounds, such as ClF and $ClF_3$, form which control the amount of free atomic fluorine in the plasma and therefore control lateral etching. Oxygen is present in the inventive etching step to produce a nonvolatile nickel oxide layer on the Ni hardmask, providing high selectivity. During the course of the inventive etching step, a passivation layer is simultaneously deposited on the vertical sidewalls of the etched Si-containing substrate. This deposition of the passivation layer occurs in-situ and does not involve a separate deposition processing step or tool. The passivation layer is believed to be a compound of nickel oxide which inhibits lateral etching and gives the inventive method its anisotropic qualities.

The passivation layer that remains on the sidewalls after etching can be removed by a conventional wet chemical etching process providing at least one opening in the Si-containing substrate that has substantially smooth and nearly vertical sidewalls as well as a clean and smooth bottom wall.

In broad terms, the method of the present invention comprises the steps of:

forming a patterned Ni hardmask on a surface of a Si-containing substrate, said patterned Ni hardmask including at least one hole that exposes a portion of the Si-containing substrate;

etching the exposed portion of the Si-containing substrate in the presence of a plasma that includes free radicals generated from a gaseous mixture of $Cl_2$, $SF_6$ and $O_2$ to provide at least one opening in the Si-containing substrate, said at least one opening having sidewalls that extend to a common bottom wall, wherein during the etching a passivation layer forms at least on the sidewalls of said at least one opening; and removing the passivation layer from the sidewalls to provide said at least one opening with substantially smooth and nearly vertical sidewalls.

The term 'substantially smooth' is used herein to denote sidewalls that contain little or no divot regions therein, while the term 'nearly vertical' denotes sidewalls that are approximately perpendicular to an upper horizontal surface of the Si-containing substrate. Some negligible tapering may occur using the inventive etching step of the present invention.

DETAILED DESCRIPTION OF THE INVENTION

Figure 1:
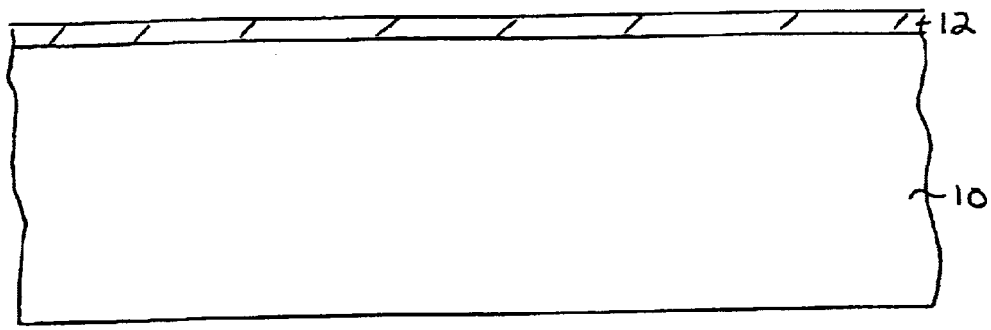
FIGS. 1–5 are pictorial representations (through cross-sectional views) illustrating the basic processing steps of the present invention.

The present invention, which provides a method of creating deep features in a Si-containing substrate for use in fabricating MEMS type devices, will now be described in greater detail by referring to the drawings that accompany the present application.

Referring first to FIG. 1, there is illustrated an initial structure that can be employed in the present invention. Specifically, the initial structure shown in FIG. 1 comprises Si-containing substrate 10 having Ni hardmask 12 formed on a top surface of the Si-containing substrate. The term "Si-containing substrate" is used herein to denote any material that includes silicon. Illustrative examples of Si-containing substrates that can be employed in the present include, but are not limited to: bulk Si, SiGe, SiC, SiGeC, epi Si/Si, Si/SiC, Si/SiGeC, and preformed silicon-on-insulators (SOIs) which include a buried oxide region that electrically isolates a top Si-containing layer from a bottom Si-containing layer. The preformed SOI substrates may be formed by separation by ion implantation of oxygen (SIMOX) or bonding and smart cutting. A highly preferred Si-containing substrate that is employed in the present invention is bulk Si.

Ni hardmask 12 is formed atop an upper surface of Si-containing substrate 10 utilizing a conventional deposition process such as, for example, sputtering, evaporation, chemical vapor deposition (CVD), plasma-assisted CVD, chemical solution deposition, or plating. In accordance with the present invention, Ni hardmask 12 is a thin layer that has a thickness of from about 1 to about 10 μm, with a thickness of from about 2 to about 6 μm being more highly preferred. The use of a thin Ni masking layer is required in the present invention for obtaining accurate patterning of the deep features in the Si-containing substrate.

Figure 2:
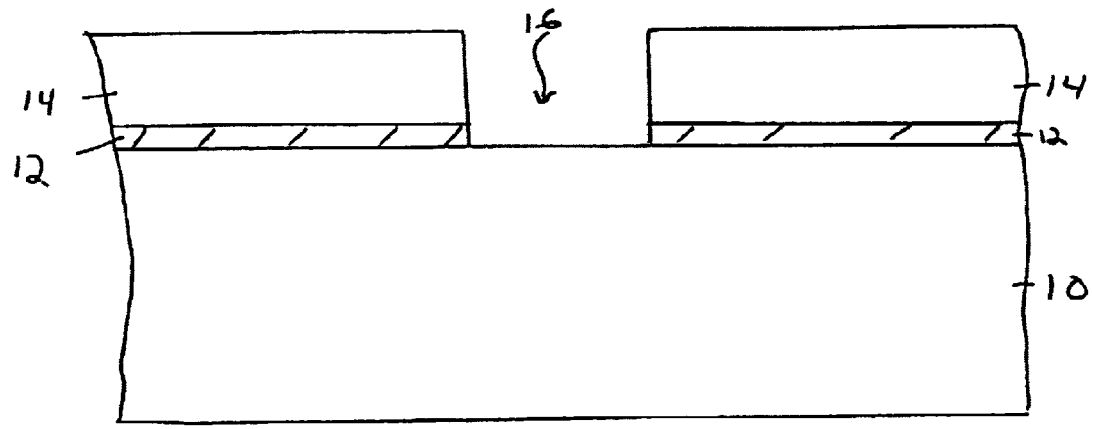

Next, and as shown in FIG. 2, a patterned photoresist 14 is formed on portions of the Ni hardmask and the patterned photoresist is used to form at least one hole 16 that exposes a portion of the underlying Si-containing substrate. The patterned photoresist is formed using conventional lithography and etching. The lithography step used in forming the patterned photoresist includes the steps of: applying a photoresist (negative-tone or positive-tone) to the surface of Ni hardmask 12, exposing the photoresist to a pattern of radiation and developing the pattern into the exposed photoresist using a conventional resist developer.

The at least one hole in the Ni hardmask is formed through the developed photoresist utilizing an etching process which is highly selective in removing Ni as compared to the photoresist or the underlying Si-containing substrate. Specifically, the at least one hole is formed in the Ni hardmask utilizing a wet etching process where a chemical etchant that selectively removes Ni is employed. Suitable chemical etchants that can be employed in the present invention in forming the hole in the Ni hardmask include, but are not limited to mixtures of: phosphoric acid (4 parts by volume)/nitric acid (1 part by volume)/acetic acid (4 parts by volume)/water (1 part by volume), or nitric acid (1 part by volume)/hydrochloric acid (1 part by volume)/water (3 parts by volume).

It should be noted that although the drawings illustrate the formation of one hole in the Ni hardmask, the present invention works equally well for forming a plurality of holes in the Ni hardmask. The plurality of holes, in turn, can be used to form a plurality of openings in the Si-containing substrate using the etching step mentioned hereinbelow.

Figure 3:
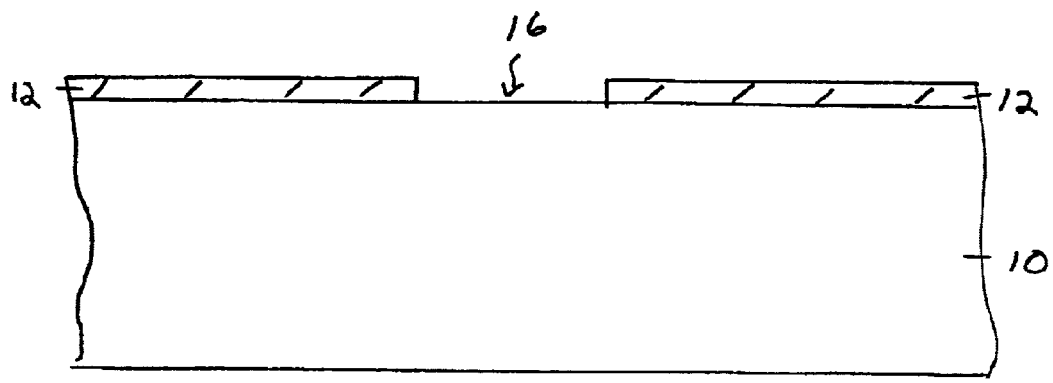

At this point in the inventive method, the patterned photoresist is removed from the patterned Ni hardmask to provide the structure shown, for example, in FIG. 3. Specifically, the patterned photoresist is removed from the structure utilizing a conventional resist stripping process which is well known to those skilled in the art. Note that the structure illustrated in FIG. 3 comprises a patterned Ni hardmask having at least one hole 16 formed therein located atop Si-containing substrate 10. As shown, a portion of the Si-containing substrate, not containing the patterned Ni hardmask, is exposed.

The exposed portion of the Si-containing substrate, not protected by the patterned hardmask, is then subjected to an etching process which is capable of selectively etching the exposed portion of Si-containing substrate 10 so as to form at least one opening 18 in the Si-containing substrate. As shown, each opening has sidewalls 20 that extend to common bottom wall 22. See FIG. 4. Specifically, the selective etching process of the present invention is an anisotropic etching process which is performed in the presence of a plasma that comprises free radicals generated from a gaseous mixture of chlorine ($Cl_2$), sulfur hexafluoride ($SF_6$) and oxygen ($O_2$). The free radicals form via the dissociation of the above-mentioned compounds.

As stated above, it is believed that the addition of $SF_6$ to $Cl_2$ increases the Si etch rate. Moreover, it is believed that, during the course of the inventive etching step, chloro-fluoro compounds, such as ClF and $ClF_3$, form which control the amount of free atomic fluorine in the plasma and therefore control lateral etching. Oxygen is present in the inventive etching step to produce nonvolatile nickel oxide layer 24 on Ni hardmask 12, providing high selectivity. During the course of the inventive etching step, passivation layer 26 is simultaneously deposited on the vertical sidewalls of the opening that is formed into Si-containing substrate 10. This deposition occurs in-situ and does not involve a separate deposition processing step or tool. The passivation layer is believed to be a compound of nickel oxide which inhibits lateral etching and gives the inventive method its anisotropic qualities.

It should be noted herein that during the inventive etching step some nickel oxide is also being deposited on the bottom wall of the opening. However, this bottom wall passivation layer is also simultaneously being etched away; therefore the amount of nickel oxide formed on the common bottom wall is negligible as compared to the amount that is formed on the etched sidewalls.

The selective etching step of the present invention may be carried out in any conventional reactive ion etching apparatus, including an ICP apparatus, which is capable of forming a plasma which includes free radicals from the above-mentioned gas mixture. Such etching apparatuses are well known to those skilled in the art; therefore, a detailed description of the same is not needed herein. Basically, the gas mixture (or each gas simultaneously) is supplied to a reaction chamber including coils for generating a plasma.

In accordance with the present invention, the gas mixture employed in the selective anisotropic etching step comprises, by mass flow in standard cubic centimeters per minute (sccm), from about 45 to about 75% $Cl_2$, from about 15 to about 45% $SF_6$, and from 5 to about 30% $O_2$. More preferably, the gas mixture employed in the present invention comprises from about 55 to about 60% $Cl_2$, from about 25 to about 30% $SF_6$, and from 10 to about 15% $O_2$. The mass flow percents of each of the individual gases in the mixture, which add up to 100%, are controlled by varying the flow rate (in seem) of each gas being employed.

In addition to the above gas mixture, the selective anisotropic etching process is performed at a pressure in the range from about 1 to about 30 mtorr, with a pressure of from about 1 to about 5 mtorr being more highly preferred. Additionally, the highly anisotropic etching step of the preset invention is carried out using an electrode that operates at a power of from about 60 W (0.76 $W/cm^2$) to about 100 W (1.27 $W/cm^2$), and a coil that operates at a power of from about 500 to about 900 W. It is noted that the above conditions, i.e., pressure, electrode power, and coil power are capable of forming a plasma containing free radicals generated from the above-mentioned gas mixture.

In addition to the above mentioned operational conditions, the highly anisotropic etching step of the present invention is performed at a temperature of from about 20° to about 30° C., with an etching temperature of about room temperature being more highly preferred. The etching time may vary depending on the desired depth of the at least one opening to be formed in the Si-containing substrate as well as on the exact etching conditions employed.

The depth of the at least one opening formed in the present invention is typically about 50 μm or greater. The depth of the at least one opening is determined from the upper horizontal surface of the Si-containing substrate to the etched common wall.

In accordance with the present invention, the at least one opening has a high aspect ratio (depth:width) of about 10:1 or greater. The etch rate of the inventive anisotropic etching process is greater than about 500 Å/min, with an etching rate of from about 8,000 to about 10,000 Å/min being more highly preferred.

Figure 4:
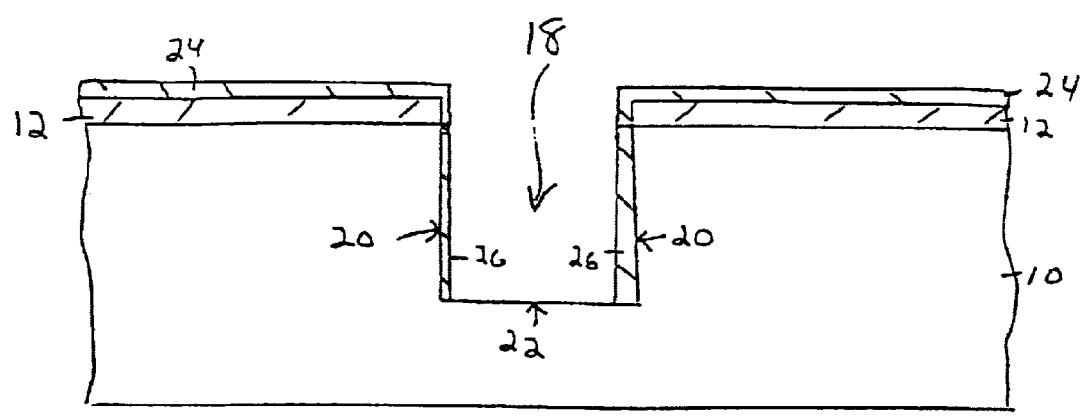

FIG. 4 illustrates the structure that is formed after the etching step described above is performed. As indicated above, and as shown in FIG. 4, nonvolatile nickel oxide layer 24 forms atop the patterned Ni hardmask and Ni oxide passivation layer 26 is also formed in opening 18 on each of the sidewalls. The thickness of the layers 24 and 26 is not critical to the present invention, and is a consequence of the amount of oxygen used in the etching process. Typically, nickel oxide layers 24 and 26 have a thickness of from about 50 to about 100 Å.

Figure 5:
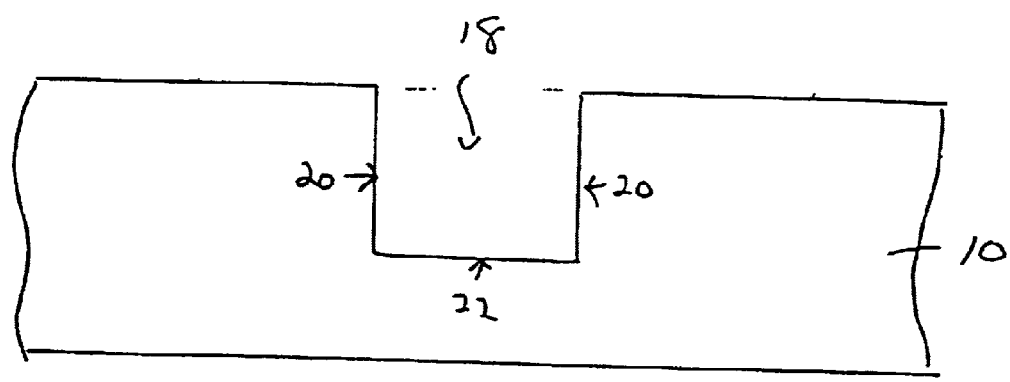

The Ni oxide formed using the anisotropic etching step of the present invention and the Ni hardmask are then removed from the structre shown in FIG. 4 so as to form the structure shown, for example, in FIG. 5. Specifically, the nickel oxide and Ni are removed using a wet etching process where a chemical etchant that is capable of selectively removing nickel oxide and Ni is employed. Illustrative examples of chemical etchants that can be employed in selectively removing the nickel oxide from the structure include, but are not limited to: phosphoric acid (4 parts by volume)/nitric acid (1 part by volume)/acetic acid (4 parts by volume)/water (1 part by volume), or nitric acid (1 part by volume)/hydrochloric acid (1 part by volume)/water (3 parts by volume). It should be noted that after the nickel oxide has been removed from the at least one opening, the at least one opening has substantially smooth and nearly vertical sidewalls which contain little or no divots as well as little or no etchant residue.

The resultant structure without the patterned Ni hardmask is shown, for example, in FIG. 5. The resultant structure which includes the at least one deep opening having substantially smooth and nearly vertical sidewalls can then be used as a substrate material for forming Si-based devices such as MEMS therein. The processing steps used in forming the Si-based devices are well known to those skilled in that art. Such processing steps are not needed to understand the scope of the present invention, but they are nevertheless meant to be included herein.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited by the exact forms and details described in illustrated, but fall within the scope of the appended claims.

What is claimed is:

1. A method for patterning a Si-containing substrate comprising the steps of:

forming a patterned Ni hardmask on a surface of a Si-containing substrate, said patterned Ni hardmask including at least one hole that exposes a portion of the Si-containing substrate;

etching the exposed portion of the Si-containing substrate in the presence of a plasma that includes free radicals generated from a gaseous mixture of $Cl_2$, $SF_6$ and $O_2$ to provide at least one opening in the Si-containing substrate, said at least one opening having sidewalls that extend to a common bottom wall, wherein during the etching a passivation layer forms at least on the sidewalls of said at least one opening; and removing the passivation layer from the sidewalls to provide said at least one opening with substantially smooth and nearly vertical sidewalls.

2. The method of claim 1 wherein said Si-containing substrate comprises bulk Si, SiGe, SiC, SiGeC, epi Si/Si, Si/SiC, Si/SiGeC, or a preformed silicon-on-insulator.

3. The method of claim 1 wherein said Si-containing substrate comprises bulk Si.

4. The method of claim 1 wherein said patterned Ni hardmask is formed by depositing Ni on the surface of the Si-containing, applying a photoresist to said Ni; exposing the photoresist to a pattern of radiation; developing the pattern into the photoresist and wet chemical etching.

5. The method of claim 1 wherein said patterned Ni hardmask has a thickness of from about 1 to about 10 $\mu$m.

6. The method of claim 1 wherein said gaseous mixture comprises, by mass flow in sccm, from about 45 to about 75% $Cl_2$, from about 15 to about 45% $SF_6$, and from 5 to about 30% $O_2$.

7. The method of claim 1 wherein said gaseous mixture preferably comprises, by mass flow in sccm, from about 55 to about 60% $Cl_2$, from about 25 to about 30% $SF_6$ and from about 10 to about 15% $O_2$.

8. The method of claim 1 wherein said etching is performed at a pressure of from about 1 to about 30 mtorr.

9. The method of claim 1 wherein said free radicals are generated by a coil operating at a power of from about 500 to about 900 W.

10. The method of claim 1 wherein said etching is performed at a temperature of from about 20° to about 30° C.

11. The method of claim 1 wherein said etching is performed in an inductively coupled plasma apparatus.

12. The method of claim 1 wherein said passivation layer has a thickness of from about 50 to about 100 Å.

13. The method of claim 1 wherein Ni oxide forms atop said patterned Ni hardmask during said etching step.

14. The method of claim 1 wherein said at least one opening has a depth of about 50 $\mu$m or greater and an aspect ratio of about 10:1 or greater.

15. The method of claim 1 wherein said passivation layer and Ni hard mask layer are removed by a wet etching process.

16. The method of claim 1 wherein said passivation layer comprises Ni oxide.

* * * * *